United States Patent [19]

Cecil

[11] 4,267,550
[45] May 12, 1981

[54] DIGITAL TO ANALOG CONVERSION CIRCUIT INCLUDING COMPENSATION FET'S

[75] Inventor: James B. Cecil, Santa Clara, Calif.

[73] Assignee: National Semiconductor Corporation, Santa Clara, Calif.

[21] Appl. No.: 115,203

[22] Filed: Jan. 25, 1980

[51] Int. Cl.² ............................................ H03K 13/02
[52] U.S. Cl. ...................... 340/347 DA; 340/347 CC
[58] Field of Search ................ 340/347 DA, 347 AD, 340/347 CC, 347 M

[56] References Cited

U.S. PATENT DOCUMENTS

| 3,540,037 | 11/1973 | Ottesen | 340/347 DA |
|---|---|---|---|
| 3,611,355 | 10/1971 | Hartke | 340/347 AD |
| 3,699,568 | 10/1972 | Thompson | 340/347 DA |
| 3,747,088 | 7/1973 | Pastoriza | 340/347 DA |
| 3,755,807 | 8/1973 | Brown | 340/347 DA |
| 3,828,345 | 8/1974 | Lode | 340/347 DA |
| 3,832,707 | 8/1974 | Buchanan | 340/347 DA |
| 3,842,412 | 10/1974 | Spofford | 340/347 DA |
| 3,882,484 | 5/1975 | Brokaw | 340/347 AD |
| 3,890,611 | 6/1975 | Pastoriza | 340/347 DA |
| 3,940,760 | 2/1976 | Brokaw | 340/347 DA |
| 4,055,773 | 10/1977 | Schoeff | 340/347 DA |

Primary Examiner—Charles D. Miller
Attorney, Agent, or Firm—Brown & Martin

[57] ABSTRACT

The disclosed digital to analog conversion circuit is comprised of a plurality of resistors interconnected as an N stage R-2R ladder network, a pair of conductive buses, and a total of N transistorized switches which respectively couple the output legs of the ladder to a selectable one of the buses in response to digital logic signals. Those switches which couple to the legs of the K most significant stages have scaled resistances that differ by powers of two; whereas the remaining switches have resistances which equal the largest scaled resistance. An MOS transistor lies in the serial leg of the Kth stage. This transistor has a resistance of approximately ⅔ the largest scaled resistance of the switches. The unscaled resistances provide for ease of fabrication, while the MOS transistor improves the accuracy with which digital to analog conversions are performed.

10 Claims, 4 Drawing Figures

| SWITCH | 31 | 32 | 33 | 34 | 35 | 36 | 37 | 38 | 39 | 40 |
|---|---|---|---|---|---|---|---|---|---|---|
| RESISTANCE | 20 | 40 | 80 | 160 | 320 | 640 | 1280 | 2560 | 5120 | 10240 |
| PHYSICAL SIZE | 0.35 104 | 0.35 52 | 0.35 26 | 0.35 13 | 0.35 6.5 | 0.35 3.25 | 0.35 1.62 | 0.35 0.80 | 0.35 0.40 | 0.70 0.40 |

TABLE I

TABLE 2

| WEIGHTED SWITCHES | LINEARITY ERROR WITHOUT COMPENSATING FET | LINEARITY ERROR WITH COMPENSATING FET |
|---|---|---|
| S1 – S5 | 0.0199 % | 0.0073 % |
| S1 – S6 | 0.0195 % | 0.0067 % |
| S1 – S7 | 0.0183 % | 0.0059 % |
| S1 – S8 | 0.0159 % | 0.0050 % |
| S1 – S9 | 0.0111 % | 0.0033 % |

DIGITAL TO ANALOG CONVERSION CIRCUIT INCLUDING COMPENSATION FET'S

BACKGROUND OF THE INVENTION

This invention relates to digital to analog (D/A) conversion circuits. Some prior art D/A circuits may be found in section 8 of the 1978 Linear Databook by National Semiconductor, for example. The type of D/A circuits with which we are here concerned include R—2R resistive ladders. Basically, these ladders are comprised of a plurality of resistors which are interconnected as a series of N stages. Each stage contains the serial leg which connects to the next stage, and a parallel output leg which is coupled via a transistorized switch to a pair of conductive output buses. This serial leg contains resistor R while the parallel output leg contains resistors 2R.

Ideally, the resistance of each of the resistors in the ladder network are identical, and the resistance through each of the switches is zero. In actual practice, however, the transistor switches always have some resistance associated with them. This is because the resistance through a conducting transistor is proportional to the transistors physical size; and to reduce that resistance to zero would cause the transistors to occupy an unreasonably large amount of chip space.

One prior art solution to this problem was to scale the resistance of each of the switches such that they differed from each other by powers of two. The switch having the smallest resistance was coupled to the output leg of the most significant stage, whereas the switch having the largest resistance was coupled to the output leg of the least significant stage. With this arrangement, it can be shown that current divides equally within each of the stages.

This solution, however, is unattractive when the D/A converter circuit has a large number of stages, such as ten or more. In that case, those switches connected to the least significant stages still must necessarily be so small that they are difficult to fabricate. Therefore, another solution to the problem of compensating for the switches resistance is desired.

Accordingly, it is a primary object of the invention to provide a digital to analog conversion circuit which compensates for inaccuracies caused by switch resistance within the circuit while simultaneously permitting the size of the switches to stay within a reasonably narrow range.

BRIEF DESCRIPTION OF THE DRAWINGS

Various preferred embodiments of the invention will best be understood by reference to the following detailed description when read in conjunction with the accompanying drawings wherein.

Figure 1:
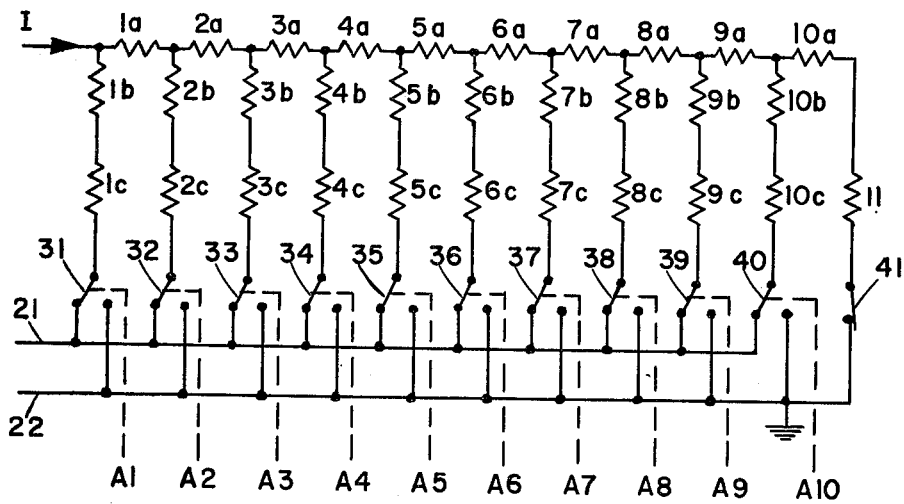
FIG. 1 is a circuit diagram of a prior art digital to analog converter which is included herein for comparison purposes.

Table 1 lists the resistance and physical size of the transistors which make up the switches in the FIG. 1 circuit.

Figure 3:
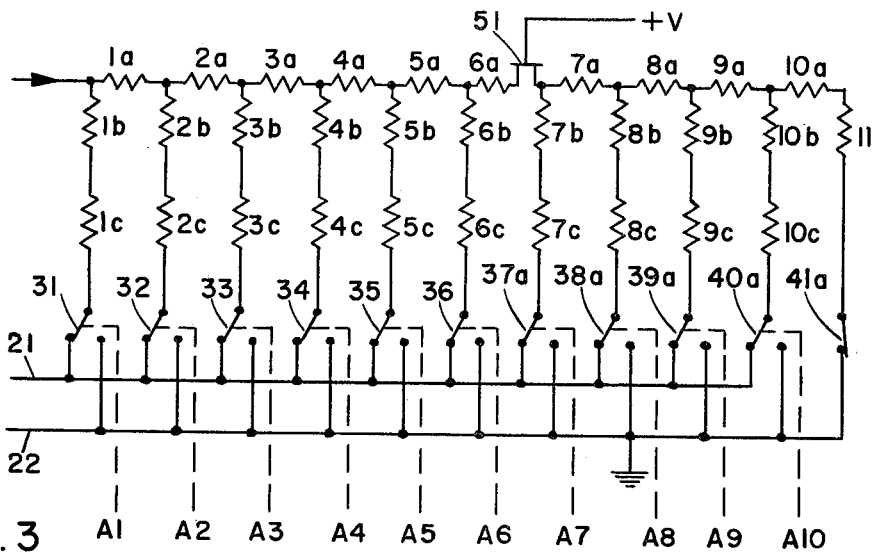

FIG. 3 illustrates one embodiment of a digital to analog converter which is constructed according to the invention.

Table 2 indicates the accuracy of the FIG. 3 circuit.

Figure 4:
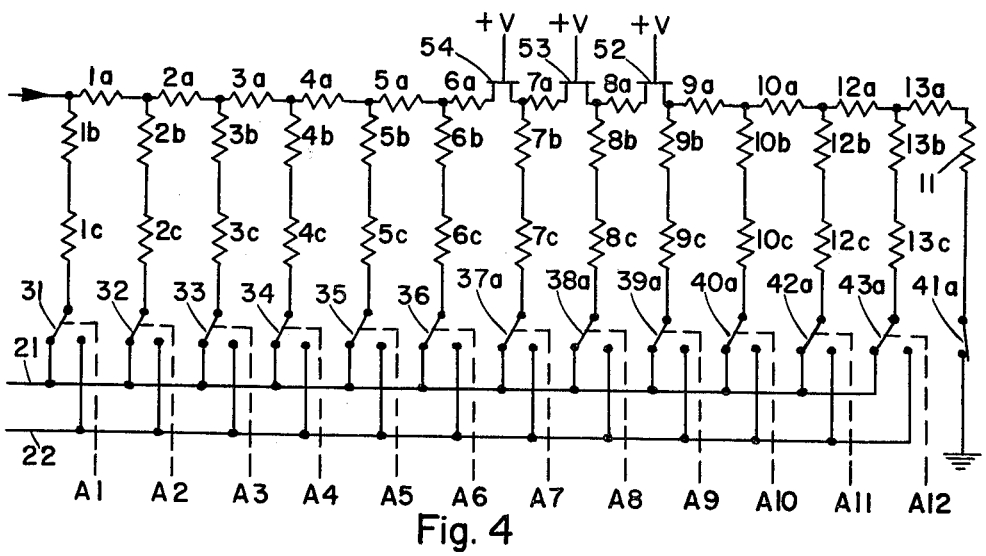

FIG. 4 illustrates another embodiment of a digital to analog converter constructed according to the invention.

DETAILED DESCRIPTION

In order to fully understand the present invention, a review of the FIG. 1 prior art D/A conversion circuit is first believed to be in order. That circuit has some structural similarities to the disclosed invention. But it also has some functional deficiencies which are compensated for by the disclosed invention.

Basically, the FIG. 1 circuit is comprised of a plurality of resistors 1 through 11, a pair of conductive output buses 21 and 22, and a plurality of transistorized switches 31 through 41. All of the resistors are interconnected as an R-2R ladder network. Resistors 1a, 1b and 1c form one stage of this ladder, resistors 2a, 2b and 2c form another stage, etc. The resistors in these stages all have substantially the same resistance; and therefore any current is divided in half as it passes through each stage.

Switches 31 through 40 operate to couple current from the output legs of the ladder network to buses 21 and 22. The output legs are formed by resistor pairs 1b and 1c, 2b and 2c, etc. Switches 31 through 41 selectively pass the current from those legs to either bus 21 or bus 22 in response to externally generated digital logic signals A1–A10.

Each of the switches 31–40 typically is implemented with a pair of FET transistors. These transistors have drains which are connected in common to one output leg of the ladder have sources which are connected respectively to one of the buses 21 and 22, and have gates which are driven by one of the logic signals or its complement. The gates of the two transistors comprising switch 31 for example, are driven by signals A1 and A1.

Other physical implementations for the switches 31–41 are of course possible as alternatives. However, each of the switches always has an inherent "on" resistance associated with it regardless of its construction. By "on" resistance, is meant the resistance through the transistor which has been selected via the logic signals to pass current. This resistance will hereinafter be referred to simply as the switches resistance. Clearly, the switch resistance adds to the resistance of the output legs of the ladder network. Thus, if it is not somehow accounted for, it will upset the current dividing process that is performed by each of the stages.

Figure 2:
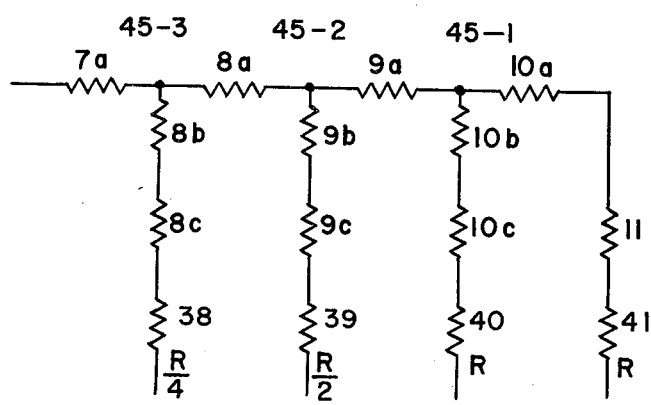
FIG. 2 illustrates a portion of the FIG. 1 circuit in greater detail.

Referring now to FIG. 2, a prior art technique by which the resistance of switches 31–40 was accounted for is illustrated. In this technique, the resistance of switch 39 is made to equal one-half the resistance of switch 40, the resistance of switch 38 is made to equal one-half the resistance of switch 39, etc.

To understand how this compensation works, consider an example wherein each of the resistances 1 through 11 are 10 k ohms. Thus, the resistance to the right of node 45-1 is equal to 10K plus R/2, where R is the resistance at switches 40 and 41. Now in order for current to divide equally between resistors 9a and 9b at node 45-2, the total resistance of resistors 9b, 9c and switch 39 must be equal to the total resistance of resistor 9a + 10K + R/2. It follows therefore, that the resistance of switch 39 must equal R/2.

Similarly, in order for current to divide equally between the resistors 8a and 8b at node 45-3, the total resistance of resistors 8b, 8c and switch 38 must be equal to the total resistance of resistor 8a+ the resistance to the right thereof. This latter resistance equals 10K+R/4. From this it follows that the resistance of switch 38 must equal R/4. The analysis can be extended to show that the resistance of switches 31–40 must progressively decrease by a factor of 2 from stage to stage.

In practice however, the above requirement is extremely difficult to meet for resistive ladder networks having a relatively large number of stages, such as 10 or more. The reason for this difficulty is indicated in Table 1. One row of that table lists a set resistances for switches 31–40 which meet the above requirements; whereas another row of that table lists the corresponding physical layout space that is required to obtain those resistance of 20 ohms which is obtainable with physical layout space of 0.35 mils long and 104 mils wide.

For the remaining switches, the width gets smaller as the resistance increases. This is because the resistance of a transistor is inversely proportional to its width. Eventually however, a point is reached where the width can no longer be decreased due to various processing limitations. One way to further lower the resistance is to increase the length dimension of the transistor, as is indicated for switch 40. But then the transistors start getting too large again.

Another problem with the above physical layout is that it is difficult to match the resistance of those transistor pairs which are relatively small in size. However, such a match is required. Otherwise the resistance of the switch won't be independent of the output bus that it is connected to. Clearly, all these problems all become increasingly more difficult to solve as additional stages are added to the D/A circuit.

The above problems are overcome by the digital to analog conversion circuit of FIG. 3 which is constructed according to the invention. Several of the components of that embodiment are the sames as those in FIG. 1, and like parts are indicated via like reference numerals. By comparison, reference numerals 37a through 40a and reference numeral 51 indicate those components which differ from the FIG. 1 embodiment. The former are a plurality of switches that respectively replace switches 37 through 40; whereas the latter is a single MOS transistor.

Switches 37a through 41a differ from their counterparts in that their resistance is not scaled. Instead, the resistance of each of these switches equals the resistance of switch 36. Thus, using the previous example of Table 1, the resistance of switches 37a–41a each equal 640 ohms. This of course means that the physical size of each transistor in those switches is in the middle of the spectrum, which is neither too large or too small.

Also, transistor 51 is constructed to have a resistance of approximately $\frac{2}{3}$ the resistance of switch 36. That value makes the total resistance through resistors 6b, 6c and switch 36 nearly equal to the total resistance through resistors 6a and to the right thereof. As a result, current divides equally between resistors 6a and 6b.

To understand why transistor 51 has a resistance of $\frac{2}{3}$ the resistance of switch 36, first consider first the resistance to the right of resistor 9a. That resistance equals 10K ohms plus the resistance of switch 41, in parallel with, another 10K ohms plus the resistance of switch 40. But the resistance of switches 40 and 41 both equal the resistance of switch 36. Therefore, the resistance to the right of resistor 9a equals 10K plus one half the resistance of switch 36.

Next, consider the resistance to the right of resistor 8a. It can be found in a similar manner. Then the resistance to the right of resistor 7a can be found etc. By this iterative process, it may be shown that after several stages, the resistance to the right of resistors 5a through 10a quickly converges to 10K plus one-third the resistance of switch 36. Thus, the resistance of transistor 51 is chosen to equal the difference between the resistance of switch 36 and the conversion resistance of one-third that value.

It is also important to realize that transistor 51 not only enables current to divide equally between resistor 6a and 6b, but it also enables current to be divided equally in each of the stages which preceed it. In other words, with transistor 51 removed, current would not divide equally between resistors 1a and 1b. However with transistor 51 inserted, current divides equally between those resistors. Of course, there will be some imbalance in the current division in those stages which follow transistor 51. However, those stages are the least significant stages of the ladder, and thus the error that they introduce is minimal.

From the above, it should be apparent that the number of switches which have unscaled resistance may be either increased or decreased. As the number increase transistor 51 simply moves to a more significant stage and the accuracy with which the circuit performs digital to analog conversions decreases. And as the number of switches having unscaled resistance decreases, transistor 51 simply moves to a less significant stage and the accuracy of the circuit increases.

Table 2 numerically illustrates how the accuracy of the FIG. 3 circuit varies with the number of weighted switches. In that table, linearly error is defined as the maximum difference between the actual analog output of the circuit and the desired output, divided by the full scale output. It is obtained by sequentially encoding signals A1–A9 to all of the possible values, and by measuring the corresponding analog outputs. Then the difference between these outputs and the corresponding desired outputs are determined. And the largest one of these differences is divided by the full scale output.

For comparison purposes, Table 2 also includes column showing the linearity error which occurs when compensating transistor 51 is omitted. Note that the error is two to three times greater than the corresponding error which occurs when transistor 51 is included.

In addition, the compensation which transistor 5 provides is substantially invariable with temperature This is true even through the resistance of switches 37a–41a varies with temperature. The reason is that those switches are comprised of transistors similar transistor 51; and therefore the resistance of both components vary with temperature in a similar manner and cancel each other out.

Referring now to FIG. 4, another embodiment of the invention will be described. This embodiment is similar to the FIG. 3 circuit; however, it includes two additional stages and two additional switches. The stages are indicated via reference numerals 12a through 13. Current from these stages is selectively transmitted one of the buses 21 and 22 through switches 42a and 43a. This embodiment also differs from the FIG. 3 circuit in that it includes three compensating transistors 5 53 and 54. Transistor 52 has a resistance of two-thirds the resistance of switch 36, whereas transistors 53 and 54 have a resistance of one-half the resistance of switch 36.

Transistor 52 operates to equalize the current division between resistors 8a and 8b. The reason for this is the same as that described above in conjunction with FIG. 3. That is, the total resistance to the right of transistor 52 converges to 10K plus one-third the resistance of switch 36. And since the resistance of switch 38a equals the resistance of switch 36, it follows that perfect current division will occur between resistors 8a and 8b by making the resistance of transistor 52 equal to two-thirds the resistance of switch 36.

Next, consider the total resistance to the right of transistor 53. It equals the resistance of resistor 8a plus the resistance of transistor 52, plus the resistance to the right thereof in parallel with the resistance of resistors 8b, 8c and switch 38a. This equals 10K plus one-half of the resistance of switch 36. Thus, in order for the resistance of resistor 7a plus transistor 53 plus the resistance to the right thereof to equal the resistance of resistors 7b plus 7c plus switch 37a, the resistance of transistor 53 must equal one-half the resistance of switch 36.

Under those conditions, the total resistance to the right of transistor 54 equals 10K plus one-half the resistance of switch 36. Thus, perfect current division will occur between resistors 6a and 6b by making the resistance of transistor 54 equal to one-half the resistance switch 36. Further, since transistors 52, 53 and 54 operate to balance the resistance through the two legs in stage 6, it follows that current will also divide equally in each of the preceding stages due to switches 31 through 36 having scaled resistances.

Some current imbalances will of course occur in the stages lying to the right of transistor 52. But again, these are the least significant stages; and thus the effect of this current imbalance or linearity error is minimized. Also, increased accuracy can be obtained simply by moving transistor 52 to one of those less significant stages and by inserting a transistor having a resistance of one-half the resistance of switch 36 in each stage lying therebetween. This embodiment is thus attractive in that it is applicable to digital to analog conversion circuits having any number of stages.

Various preferred embodiments of the invention have now been described in detail. In addition, several changes and modifications may be made to these embodiments without departing from the nature and spirit of the invention. Thus, it is to be understood that the invention is not limited to said details but is defined by the appended claims.

I claim:

1. An integrated circuit for performing digital to analog conversions with improved accuracy, said circuit being comprised of:
   a plurality of resistors interconnected as an R$-$2R ladder network having N states with output legs for carrying currents I, I $2^1$, ... I $2^{N-1}$ respectively, where N is any integer;
   a pair of conductive output buses: and
   a total of N transistorized switch means coupled respectively to said N output legs of said ladder for switching said current received therefrom to a selectable one of said buses in response to externally generated digital signals;
   wherein the K switch means which couple the K most significant currents from said output legs to said buses have scaled resistances R, R$\times 2^1$, ... R$\times 2^{K-1}$ respectively where K is any integer less than N and R is any predetermined resistance;
   each of the remaining N-K switch means have unscaled resistances of R$\times 2^{K-1}$; and
   a compensating resistive means having a resistance of approximately two-thirds R$\times 2^{K-1}$ is included in the serial leg of stage K.

2. A circuit according to claim 1 wherein each of said switch means consists of a single pair of MOS transistors.

3. A circuit according to claim 1 wherein each of said compensating resistive means is a single MOS transistor.

4. A circuit according to claim 1 wherein the number N of said stages is at least 10.

5. A circuit according to claim 1 wherein said resistance R$\times 2^{K-1}$ is between 300–3,000 ohms.

6. An integrated circuit for performing digital to analog conversions with improved accuracy; said circuit being comprised of:
   a plurality of resistors interconnected as an R-2R ladder network having N stages with output legs for carrying currents I, I$\div 2^1$, ... I$\div 2^{N-1}$ respectively, where N is any integer;
   a pair of conductive output buses; and
   a total of N transistorized switch means coupled respectively to said N output legs of said ladder for switching said current received therefrom to a selectable one of said buses in response to externally generated digital signals;
   wherein the K switch means which couple the K most significant currents from said output legs to said buses have scaled resistances R, R$\times 2^1$, ... R$\times 2^{K-1}$ respectively where K is any integer less than N and R is any predetermined resistance;
   each of the remaining N-K switch means have unscaled resistances of R$\times 2^{K-1}$;
   a compensating resistive means having a resistance of approximately two-thirds R$\times 2^{K-1}$ is included in the serial leg of stage J of said ladder, where J is any integer between K and N; and
   a compensating resistive means having a resistance of approximately one-half R$\times 2^{K-1}$ is included in the serial leg of each of the stages K through J-1.

7. A circuit according to claim 6 wherein each of said switch means consists of a single pair of MOS transistors.

8. A circuit according to claim 6 wherein each of said compensating resistive means is a single MOS transistor.

9. A circuit according to claim 6 wherein the number N of said stages is at least 10.

10. A circuit according to claim 6 wherein said resistance R$\times 2^{K-1}$ is between 300–3,000 ohms.

* * * * *